United States Patent [19]
Naka

[11] Patent Number: 5,936,456
[45] Date of Patent: Aug. 10, 1999

[54] OUTPUT DRIVER CIRCUIT IN SEMICONDUCTOR DEVICE

[75] Inventor: Naoaki Naka, Kawasaki, Japan

[73] Assignee: Fujitsu Limited, Kawasaki, Japan

[21] Appl. No.: 08/934,510

[22] Filed: Sep. 17, 1997

[30] Foreign Application Priority Data

Dec. 10, 1996 [JP] Japan .................................. 8-329453

[51] Int. Cl.$^6$ .............................................. H03K 17/687
[52] U.S. Cl. ........................................... 327/437; 327/112
[58] Field of Search .................................. 327/108, 112, 327/427, 434, 437, 440, 534, 537, 538, 540–546; 326/81, 82, 83, 85

[56] References Cited

U.S. PATENT DOCUMENTS

| 4,782,250 | 11/1988 | Adams et al. | 327/108 |
| 4,837,460 | 6/1989 | Uchida | 327/437 |
| 5,151,619 | 9/1992 | Austin et al. | 326/86 |
| 5,160,855 | 11/1992 | Dobberpuhl | 327/108 |
| 5,379,174 | 1/1995 | Kasamoto | 361/56 |
| 5,760,618 | 6/1998 | Deliyannides et al. | 327/108 |

FOREIGN PATENT DOCUMENTS

| 0 614 279 A2 | 9/1994 | European Pat. Off. . |
| 0 695 037 A1 | 1/1996 | European Pat. Off. . |

OTHER PUBLICATIONS

Patent Abstracts of Japan, vol. 014, No. 320 (E–0950), Jul. 10, 1990 & JP 02 105624 A, Apr. 18, 1990.
Patent Abstracts of Japan, vol. 006, No. 081 (E–107), May 19, 1982 & JP 57 017227 A, Jan. 28, 1982.

*Primary Examiner*—My-Trang Nu Ton
*Attorney, Agent, or Firm*—Nikaido, Marmelstein, Murray & Oram LLP

[57] ABSTRACT

A power-supply circuit 121 generates a potential Vw which is approximately the higher of a power-supply potential VDD and a potential Vo at an output to set the potential Vw at an N-well of a pMOS pull-up transistor Qu equal to or higher than the potential at the source S and the drain D of the pMOS transistor Qu. The power-supply circuit 122 generates a potential Vs approximately equal to VDD—Vth when Vo<VDD, and turns off when Vo>VDD to prevent a current from flowing from the output OUT through the pMOS transistor Qu to the power-supply potential VDD, where Vth is the threshold voltage of the MOS transistors.

20 Claims, 4 Drawing Sheets

POWER SUPPLY CIRCUIT

POWER SUPPLY CIRCUIT

3

OUTPUT DRIVER CIRCUIT IN SEMICONDUCTOR DEVICE

BACKGROUND OF THE INVENTION

1. Field of the Invention

The present invention relates to an output driver circuit in semiconductor device.

2. Description of the Related Art

Larger scale semiconductor integrated circuits and more microminiaturized circuit elements result in a lower power-supply voltage and a larger number of I/O pins, which necessitates a plurality of power-supply voltages in an apparatus in which a plurality of semiconductor devices are connected.

FIG. 4 shows a prior art output driver circuit and its periphery.

A semiconductor device 10 and a semiconductor device 20 are connected with each other by a bi-directional bus line 30. In the semiconductor device 10, an output driver circuit 12, which operates on output signals S1 and S2 from a pre-driver circuit 11, is formed at its output stage. In the output driver circuit 12, the source S and the drain D of a pMOS transistor Qu are respectively connected with a wiring at a power-supply potential VDD and an output OUT, and the source S and the drain D of an nMOS transistor Qd are respectively connected to a wiring at a reference potential VSS and the output OUT. For instance, the semiconductor device 10 operates at 3.3 V, whereas the semiconductor device 20 operates at 5.0 V, with VDD=3.3 V and VSS=0 V.

When a signal is output from the semiconductor device 20 to the bi-directional bus line 30, the signals S1 and S2 are respectively set to a high and a low in order to set the output from the output driver circuit 20 at a high impedance state.

However, when the output OUT is at 5 V, a forward current flows at the PN junction diode between the drain D and an N-well of the pMOS transistor Qu, and the current flows to a wiring of the power-supply potential VDD through the pMOS transistor Qu to increase the potential at VDD to a near 5 V. This may cause an erroneous operation in a circuit connected to the power-supply potential VDD, e.g., an input buffer circuit (not shown) in particular, or may accelerate the process of degradation due to a high level of voltage stress to reduce reliability.

If, in the semiconductor device 10, the gate oxide film of the MOS transistors connected to the bi-directional bus line 30 is made thicker than that of another, the number of manufacturing steps increases, resulting in higher production costs.

If 5 V is used as the power-supply potential VDD to prevent the current from flowing in the reverse direction at the pMOS transistor Qu, it becomes necessary to provide an interface circuit between the pre-driver circuit 11 and the output driver circuit 12. Furthermore, if 5 V is supplied from the outside of the semiconductor device 10, it will restrict the number of pins used for signal input/output at the semiconductor device 10 and, therefore, will conflict with the need for a larger number of pins. If, on the other hand, a step-up circuit is provided for the output driver circuit 12 in the semiconductor device 10 in order to satisfy the need for more pins, the area occupied by the step-up circuit will be relatively large since the drive capacity of the circuit 12 is relatively large, thereby preventing higher integration of the circuits in the semiconductor device 10.

SUMMARY OF THE INVENTION

Accordingly, an object of the present invention is to provide an output driver circuit in a semiconductor device and the semiconductor device which do not require: an additional power-supply voltage for the output driver circuit to be supplied from the outside; a step-up circuit for the output driver circuit; or the gate oxide film of MOS transistors connected to the output of the output driver circuit to be made thicker.

According to an aspect of the present invention, there is provided an output driver circuit including a pMOS pull-up transistor formed on a N-well and an nMOS pull-down transistor, the pMOS pull-up transistor and the nMOS pull-down transistor being connected in series between first and second wirings, the first wiring being supplied with a first power-supply potential VDD, the second wiring being supplied with a second power-supply potential VSS that is lower than the first power-supply potential VDD, drains of the pMOS pull-up transistor and the nMOS pull-down transistor being connected to an output of the output driver circuit, comprising: a first power-supply circuit, supplied with the first power-supply potential VDD and a potential Vo at the output, for generating a potential approximately equal to the higher of the first power-supply potential VDD and the potential Vo at the output as an N-well potential Vw to supply to the N-well; and a second power-supply circuit having a switching element for high voltage cutoff connected between the first wiring and a source of the pMOS pull-up transistor, and having a switch control circuit for turning off the switching element when Vo>VDD and for turning on the switching element when Vo<VDD.

With the above aspect of the present invention, since the first power-supply circuit ensures that the N-well potential Vw of the pMOS pull-up transistor is equal to or greater than the potentials of the source S and the drain D of the pMOS pull-up transistor, even when the potential Vo, which is higher than the first power-supply potential VDD, is applied to the output, no forward voltage is applied to either of the PN junctions between the N-well and the source S of the pMOS pull-up transistor and between the N-well and the drain D of the pMOS pull-up transistor. In addition, the second power-supply circuit prevents a current from flowing to the first power-supply potential VDD through the pMOS pull-up transistor from the output OUT when Vo>VDD.

Consequently, advantages are achieved in that it is not necessary to supply the power-supply voltage to the output driver circuit from the outside, in that no step-up circuit for the output driver circuit is required and in that it is not necessary to make the thickness of the gate oxide film of the MOS transistor connected to the output of the output driver circuit thicker.

In the 1st mode of the present invention, the first power-supply circuit comprises: a first switching element, connected between the first wiring and the N-well, having a control input supplied with the potential Vo at the output; and a second switching element, connected between the output and the N-well, having a control input supplied with the first power-supply potential VDD.

With the 1st mode, the potential that is approximately equal to the higher of the potential of the first power-supply potential VDD and the potential Vo at the output is supplied to the N-well as the N-well potential Vw.

In the 2nd mode of the present invention, the first switching element includes a first pMOS transistor whose N-well receives the N-well potential Vw; and wherein the second switching element includes a second pMOS transistor whose N-well receives the N-well potential Vw.

With the 2nd mode, when Vo>VDD, a forward voltage is applied to the PN junction between the source S and the N-well of the second pMOS transistor resulting in the potential Vw being approximately Vo which is lower than the potential Vo. At this state, the first pMOS transistor is turned off. When Vo<VDD, a forward voltage is applied to the PN junction between the source S and the N-well of the first pMOS transistor, thereby turning on the first pMOS transistor and setting the potential Vw to approximately VDD which is lower than the first power-supply potential VDD. At this state, the second pMOS transistor is turned off.

In the 3rd mode of the present invention, the switching element for high voltage cutoff includes a third pMOS transistor, the third pMOS transistor having a N-well supplied with the well potential Vw and having a gate controlled by the switch control circuit.

In the 4th mode of the present invention, the switch control circuit comprises: a third switching element, connected between the output and the gate of the third pMOS transistor, having a control input supplied with the potential Vo at the output; and a fourth switching element, connected between the second wiring and the gate of the third pMOS transistor, being turned on when a control signal to its control input is active, being turned off when the control signal is inactive.

With the 4th mode, when a signal is output from the output of the output driver circuit, the fourth switching element is turned on by setting the control signal into an active state. The third switching element is turned off. Consequently, the switching element for high voltage cutoff is turned on.

In the 5th mode of the present invention, the third switching element includes: a fourth MOS transistor, the fourth pMOS transistor having an N-well supplied with the N-well potential Vw.

When Vo>VDD+Vthp, where Vthp is an absolute value of the threshold voltage of the pMOS transistors, the fourth pMOS transistor is turned on and the potential Vo transmits through the fourth pMOS transistor to be supplied to the gate of the third pMOS transistor as a potential Vg. The potential Vw is approximately equal to Vo as described above. On the other hand, since the potential applied to the gate of the pMOS pull-up transistor is at the first power-supply potential VDD at the maximum. Therefore, if the potential Vo, which satisfies Vo>VDD+Vthp, is provided to the output OUT, the pMOS pull-up transistor is turned on and the potential of the drain D of the third pMOS transistor is set to approximately equal to that of Vg. As a result, the third pMOS transistor is turned off, thereby preventing a current from flowing to a wiring of the first power-supply potential VDD.

In the 6th mode of the present invention, the fourth switching element includes: a first nMOS transistor receiving the control signal at its gate.

In the 7th mode of the present invention, the fourth switching element it further includes: a second nMOS transistor, connected between the gate of the third pMOS transistor and the first nMOS transistor, the second nMOS transistor having a gate supplied with such a third power-supply potential that the second nMOS transistor is on when the first nMOS transistor is on.

With the 7th mode, since the power-supply potential at the second nMOS transistor is approximately equal to VGG—Vthn, where Vthn is the a threshold voltage of the nMOS transistors, an advantage is achieved in that the first nMOS transistor is prevented from an accelerated degradation, which would be accelerated because of the high voltage applied between the drain and the source of the first nMOS transistor if the second nMOS transistor did not exist.

In the 8th mode of the present invention, it further comprises: a third nMOS transistor connected between the nMOS pull-down transistor and the pMOS pull-up transistor, the third nMOS transistor having a gate supplied with such a fourth power-supply potential that the third nMOS transistor is on when the pull-down nMOS transistor is on.

With the 8th mode, since the third nMOS transistor functions in a manner that is similar to that in which the second nMOS transistor described above functions, an advantage is achieved in that the nMOS pull-down transistor is prevented from an accelerated degradation.

According to another aspect of the present invention, there is provided a semiconductor device comprising an output driver circuit formed on a semiconductor chip, the output driver circuit including a pMOS pull-up transistor formed on a N-well and an nMOS pull-down transistor, the pMOS pull-up transistor and the nMOS pull-down transistor being connected in series between first and second wirings, the first wiring being supplied with a first power-supply potential VDD, the second wiring being supplied with a second power-supply potential VSS that is lower than the first power-supply potential VDD, drains of the pMOS pull-up transistor and the nMOS pull-down transistor being connected to an output of the output driver circuit, comprising: a first power-supply circuit, supplied with the first power-supply potential VDD and a potential Vo at the output, for generating a potential approximately equal to the higher of the first power-supply potential VDD and the potential Vo at the output as an N-well potential Vw to supply to the N-well; and a second power-supply circuit having a switching element for high voltage cutoff connected between the first wiring and a source of the pMOS pull-up transistor, and having a switch control circuit for turning off the switching element when Vo>VDD and for turning on the switching element when Vo<VDD.

DESCRIPTION OF THE PREFERRED EMBODIMENTS

Figure 1:
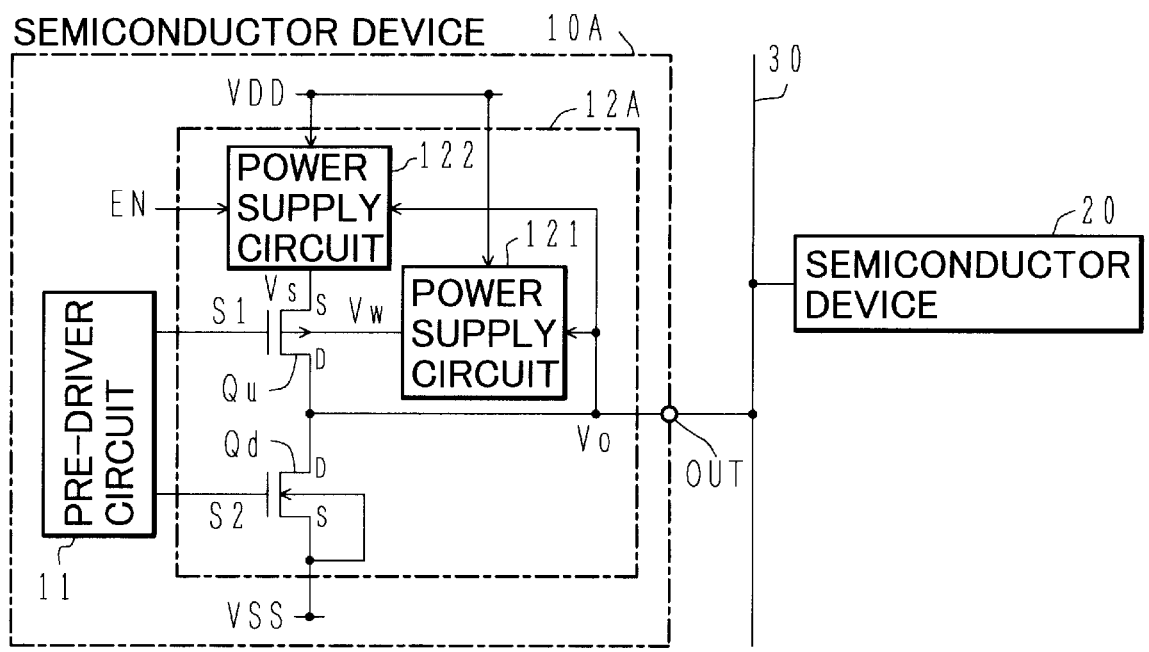
FIG. 1 is a diagram showing an output driver circuit and its periphery in a first embodiment according to the present invention.

Referring now to the drawings, wherein like reference characters designate like or corresponding parts throughout several views, preferred embodiments of the present invention are described below.

First embodiment

Figure 4:
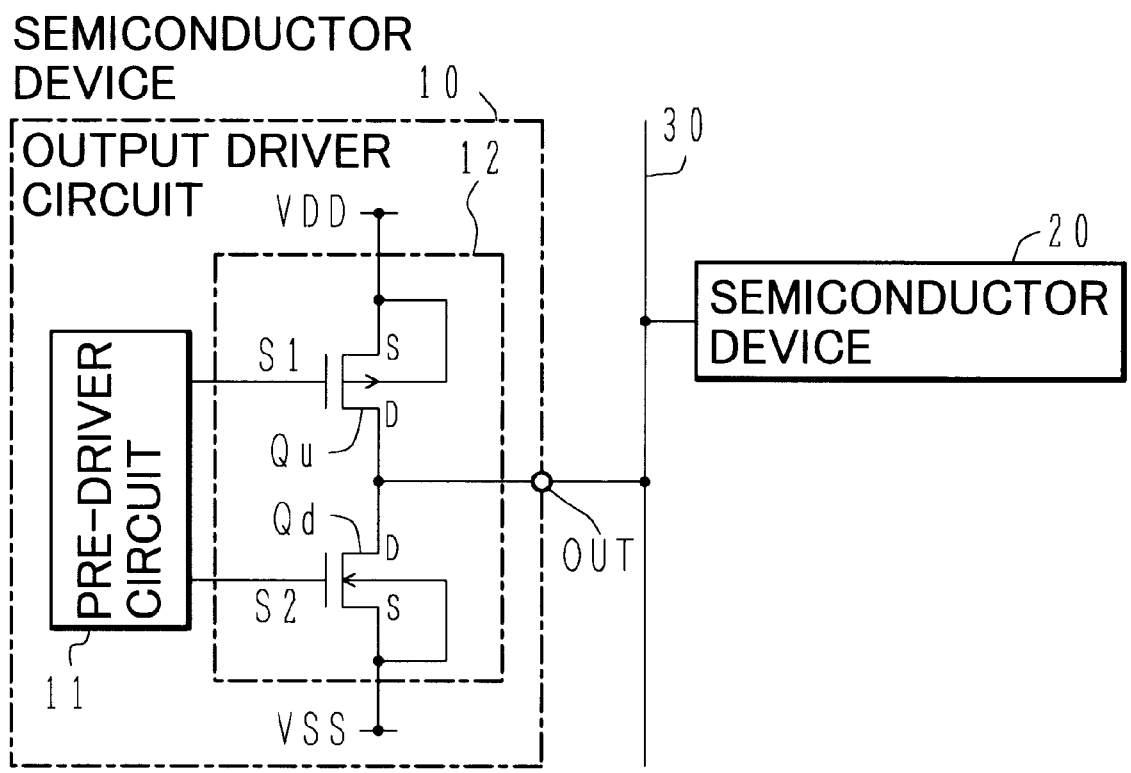
FIG. 4 is a diagram showing an output driver circuit and its periphery in the prior art.

FIG. 1 shows an output driver 12A and its periphery, which is achieved by improving the output driver 12 shown in FIG. 4. This periphery is identical to that shown in FIG. 4.

A semiconductor device 10A and a semiconductor device 20 are connected with each other by a bi-directional bus line 30. In the semiconductor device 10A, the output driver circuit 12A, which operates on signals S1 and S2 from a pre-driver circuit 11, is formed at its output stage. For instance, the semiconductor device 10A operates at 3.3 V whereas the semiconductor device 20 operates at 5.0 V, with VDD=3.3 V and VSS=0 V. The pre-driver circuit 11 operates at a voltage between a power-supply potential VDD as a first power-supply potential, and a reference potential VSS as a second power-supply potential, and the potential of an enable signal EN as a control signal is a high of approximately VDD or a low of approximately VSS.

In the output driver circuit 12A, the drains D of a pMOS pull-up transistor Qu and a pull-down nMOS transistor Qd are both connected to an output OUT of the semiconductor device 10A. In the pMOS transistor Qu, a p-type source S and a p-type drain D are formed in an N-well.

A potential Vw is supplied by the power-supply circuit 121 to the N-well of the pMOS transistor Qu. Based upon the power-supply potential VDD and the potential Vo at the output OUT, the power-supply circuit 121 generates the potential Vw which is approximately equal to the higher potential of the power-supply potential VDD and the potential Vo. This ensures that the potential Vw at the N-well of the pMOS transistor Qu is at or higher than the potential at the source S and the drain D of the pMOS transistor Qu and no forward voltage is applied to either of the two PN junctions between the well and the source S and between the well and the drain D of the pMOS transistor Qu.

A potential Vs is supplied by the power-supply circuit 122 to the source S of the pMOS transistor Qu. Based upon the power-supply potential VDD, the potential Vo and the enable signal EN, the power-supply circuit 122 generates the potential Vs which is approximately equal to VDD—Vth when the enable signal EN is a high and Vo<VDD, and is turned off when the enable signal EN is a low and Vo>VDD, where Vth is the threshold voltage of the MOS transistors, which is within a range of 0.5 to 1 V. In the latter case, no current is allowed to flow from the output OUT to the power-supply potential VDD through the pMOS transistor Qu.

The source S of the nMOS transistor Qd is connected to a wiring of the reference potential VSS.

Figure 2A:
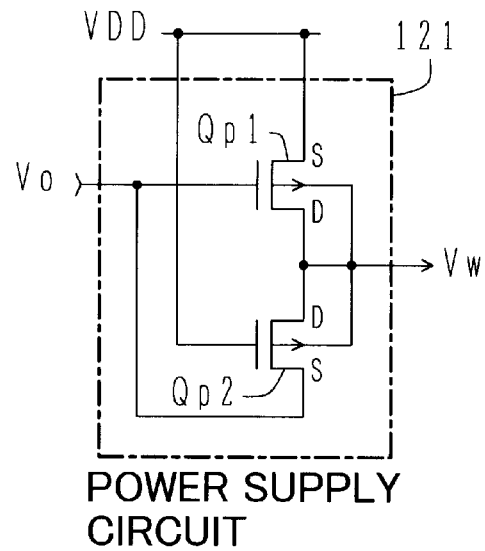
FIGS. 2(A) and 2(B) are diagrams respectively showing structural examples of power-supply circuits 121 and 122 in FIG. 1.
Figure 2B:
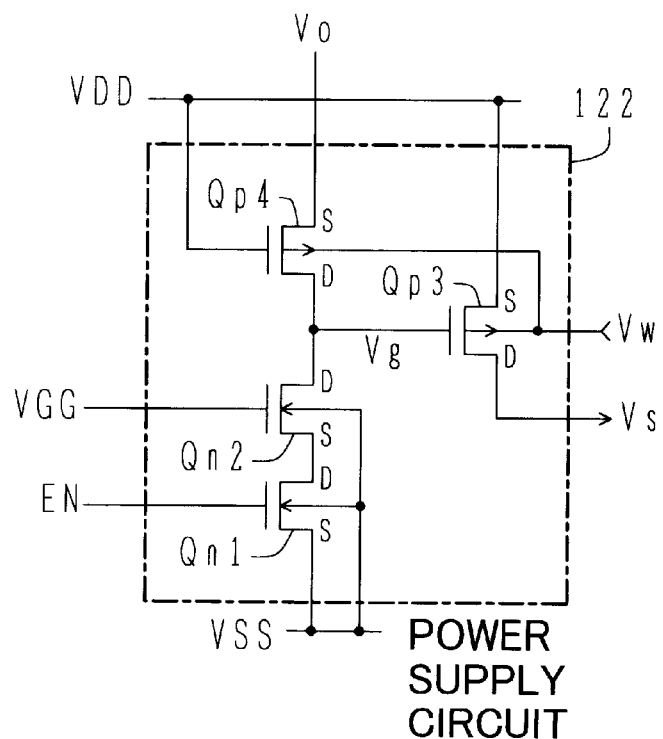

Structural examples of the power-supply circuits 121 and 122 are shown in FIGS. 2(A) and 2(B) respectively.

In the power-supply circuit 121, a pMOS transistor Qp1 as a first switching element and a pMOS transistor Qp2 as a second switching element are connected in series, the power-supply potential VDD is supplied to the source S of the pMOS transistor Qp1 and the gate of the pMOS transistor Qp2, and a potential Vo is supplied to the gate of the pMOS transistor Qp1 and the source S of the pMOS transistor Qp2. The potential Vw at the drains D of the pMOS transistor Qp1 and the pMOS transistor Qp2 that are commonly connected is supplied to the N-wells of the pMOS transistors Qp1 and Qp2.

When Vo>VDD, a forward voltage is applied to the PN junction between the source S and the N-well of the pMOS transistor Qp2, thereby the potential Vw becoming approximately Vo which is lower than Vo and the pMOS transistor Qp1 turning off. When Vo<VDD, a forward voltage is applied to the PN junction between the source S and the N-well of the pMOS transistor Qp1, thereby the pMOS transistor Qp1 turning on, the potential Vw becoming approximately VDD which is lower than VDD, and the pMOS transistor Qp2 turning off.

In the power-supply circuit 122 in FIG. 2(B), the power-supply potential VDD and the potential Vg are respectively supplied to the source S and the gate of a pMOS transistor Qp3 as a switching element for high voltage cutoff, and the potential Vs is supplied from the drain D of the pMOS transistor Qp3. A switch control circuit for the pMOS transistor Qp3 is connected between the wiring of the potential Vo and the wiring of the reference potential VSS.

In this switch control circuit, a pMOS transistor Qp4 as a third switching element, nMOS transistors Qn2 and Qn1 as a fourth switching element are connected in series. The power-supply potentials VDD and VGG and an enable signal EN are respectively supplied to the gates of the pMOS transistor Qp4, the nMOS transistors Qn2 and Qn1, and the potential at the drains of the pMOS transistor Qp4 and the nMOS transistor Qn2 is supplied to the gate of the pMOS transistor Qp3 as a potential Vg. The potential Vw output from the power-supply circuit 121 is supplied to each of the N-wells of the pMOS transistors Qp3 and Qp4 and the reference potential VSS is supplied to each of the P-wells of the nMOS transistors Qn1 and Qn2. The power-supply potential VGG may be equal to, for instance, the power-supply potential VDD.

(1) In case of outputting a signal from the semiconductor device 20 to the bi-directional bus line 30:

In this case, the enable signal EN is set to a low in the semiconductor device 10A to turn off the nMOS transistor Qn1. When Vo>VDD+Vthp, where Vthp is an absolute value of a threshold voltage of the pMOS transistors, the pMOS transistor Qp4 is turned on and the potential Vo transmits through the pMOS transistor Qp4 to be supplied to the gate of the pMOS transistor Qp3 as the potential Vg. As described above, the potential Vw becomes nearly equal to Vo. In addition, since the potential of the signal S1 even at its maximum is equal to the power-supply potential VDD. Therefor, when the potential Vo, which satisfies Vo>VDD+Vthp, is applied to the output OUT, the pMOS transistor Qu is turned on, the potential at the drain D of the pMOS transistor Qp3 becoming nearly equal to Vg. Thus, the pMOS transistor Qp3 is turned off, which prevents a current from flowing through pMOS transistors Qu and Qp3 to the power-supply potential VDD.

VGG is, for instance, equal to the power-supply potential VDD and so the nMOS transistor Qn2 is turned on. However, since the potential at the source S of the nMOS transistor Qn2 becomes approximately equal to VGG—Vthn, where Vthn is a threshold voltage of the nMOS transistors, the nMOS transistor Qn1 is prevented from an accelerated degradation, which would occur due to a high voltage applied between the drain and the source of the nMOS transistor Qn1 if the nMOS transistor Qn2 did not exist.

When Vo<VDD+Vthp, the pMOS transistor Qp4 is turned off and the potential Vg is sustained at the capacities of the gate of the pMOS transistor and the wiring connected thereto, and even when the pMOS transistor Qp3 is turned on, the potential Vs remains lower than the power-supply potential VDD. When the enable signal EN is a low, the signals S1 and S2 are set to a high and a low respectively, turning off both the pMOS transistor Qu and the nMOS transistor Qd, and setting the output from the output driver circuit 12B into a high impedance state.

(2) In case of outputting a signal from the semiconductor device 10A to the bi-directional bus line 30:

In this case, the output of the semiconductor device 20 is set in a high impedance state, and the enable signal EN is set to a high in the semiconductor device 10A thereby turning on the nMOS transistor Qn1 and the nMOS transistor Qn2. With this, since the potential Vo is equal to or lower than the power-supply potential VDD, the pMOS transistor Qp4 is off. Therefor, the pMOS transistor Qp3 is turned on and the power-supply potential VDD transmits through the pMOS transistor Qp3 to be supplied to the source S of the pMOS transistor Qu as the potential Vs. Consequently, the pMOS transistor Qu and the nMOS transistor Qd perform normal operation in correspondence to the signals S1 and S2 respectively.

Second embodiment

In the circuit shown in FIG. 1, when a signal with a potential higher than the power-supply potential VDD, e.g., a signal at 5 V, is output from the semiconductor device 20 to the bi-directional bus line 30, since this voltage is applied between the drain and the source of the nMOS transistor Qd, the process of degradation of the nMOS transistor Qd is accelerated.

Figure 3:
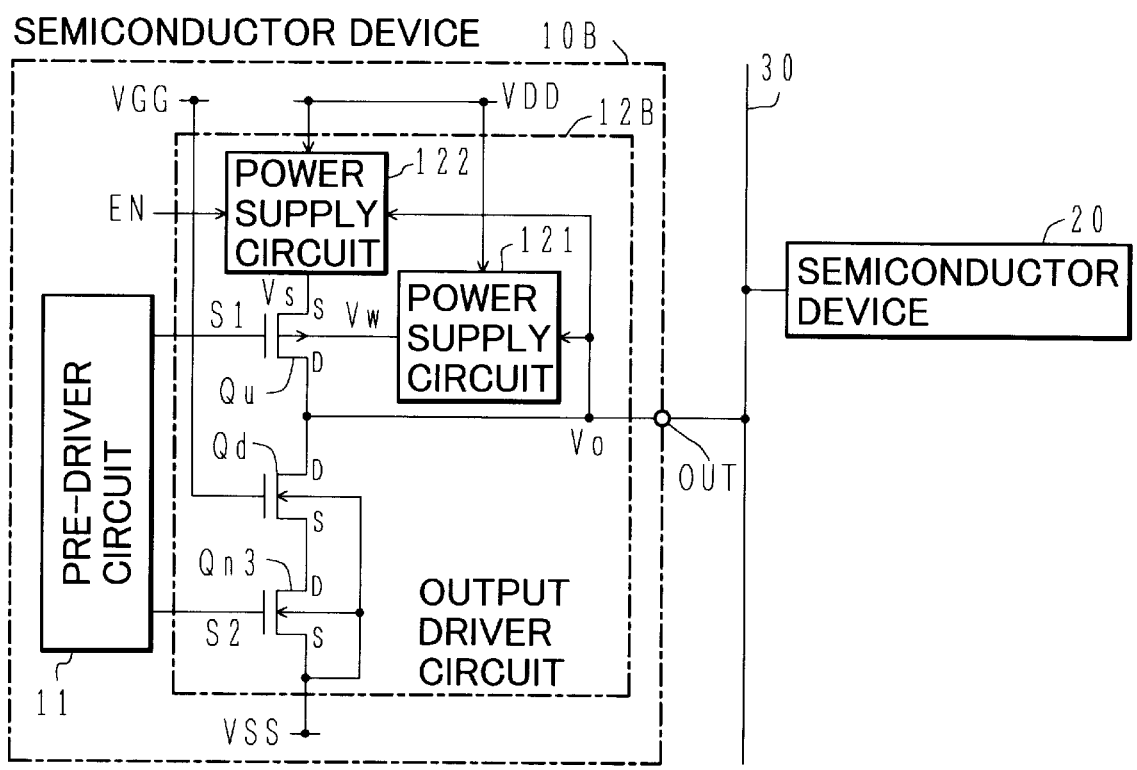
FIG. 3 is a diagram showing an output driver circuit and its periphery in a second embodiment according to the present invention.

To deal with this, in the circuit of the second embodiment, as shown in FIG. 3, an nMOS transistor Qn3 is connected between the nMOS transistor Qd and the wiring of the reference potential VSS in an output driver 12B of a semiconductor device 10B. The power-supply potential VGG is supplied to the gate of the nMOS transistor Qn3. Since this nMOS transistor Qn3 functions in a manner identical to that in which the nMOS transistor Qn2 in FIG. 2(B) functions, the nMOS transistor Qd is prevented from an accelerated degradation.

Other points are identical to those of the circuit shown in FIG. 1.

In the second embodiment, without making the gate oxide films of all the MOS transistors in the output driver circuit 12B thicker, the allowable voltage at the output OUT is increased to about 1.5 to 2.0 times the withstand voltage of these MOS transistors.

What is claimed is:

1. An output driver circuit including a pMOS pull-up transistor formed on a N-well and an nMOS pull-down transistor, said pMOS pull-up transistor and said nMOS pull-down transistor being connected in series between first and second wirings, said first wiring being supplied with a first power-supply potential VDD, said second wiring being supplied with a second power-supply potential VSS that is lower than said first power-supply potential VDD, drains of said pMOS pull-up transistor and said nMOS pull-down transistor being connected to an output of said output driver circuit, comprising:

a first power-supply circuit, supplied with said first power-supply potential VDD and a potential Vo at said output, for generating a potential approximately equal to the higher of said first power-supply potential VDD and said potential Vo at said output as an N-well potential Vw to supply to said N-well; and a second power-supply circuit, supplied with said first power-supply potential VDD and the potential Vo, having a switching element for high voltage cutoff connected between said first wiring and a source of said pMOS pull-up transistor, and having a switch control circuit for turning off said switching element when Vo>VDD and for turning on said switching element when Vo<VDD.

2. An output driver circuit according to claim 1, wherein said first power-supply circuit comprises:

a first switching element, connected between said first wiring and said N-well, having a control input supplied with said potential Vo at said output, being turned off when Vo>VDD, being turned on when Vo<VDD; and a second switching element, connected between said output and said N-well, having a control input supplied with said first power-supply potential VDD, being turned on when Vo>VDD, being turned off when Vo<VDD.

3. An output driver circuit according to claim 2, wherein said first switching element includes a first pMOS transistor whose N-well receives said N-well potential Vw; and wherein said second switching element includes a second pMOS transistor whose N-well receives said N-well potential Vw.

4. An output driver circuit according to claim 1, wherein said switching element for high voltage cutoff includes a third pMOS transistor, said third pMOS transistor having a N-well supplied with said well potential Vw and having a gate controlled by said switch control circuit.

5. An output driver circuit according to claims 4, further comprising:

a third nMOS transistor connected between said nMOS pull-down transistor and said pMOS pull-up transistor, said third nMOS transistor having a gate supplied with such a fourth power-supply potential that said third nMOS transistor is on when said pull-down nMOS transistor is on.

6. An output driver circuit according to claim 2, wherein said switching element for high voltage cutoff includes a third pMOS transistor, said third pMOS transistor having a N-well supplied with said well potential Vw and having a gate controlled by said switch control circuit.

7. An output driver circuit according to claims 2, further comprising:

a third nMOS transistor connected between said nMOS pull-down transistor and said pMOS pull-up transistor, said third nMOS transistor having a gate supplied with such a fourth power-supply potential that said third nMOS transistor is on when said pull-down nMOS transistor is on.

8. An output driver circuit according to claims 6, further comprising:

a third nMOS transistor connected between said nMOS pull-down transistor and said pMOS pull-up transistor, said third nMOS transistor having a gate supplied with such a fourth power-supply potential that said third nMOS transistor is on when said pull-down nMOS transistor is on.

9. An output driver circuit according to claim 3, wherein said switching element for high voltage cutoff includes a third pMOS transistor, said third pMOS transistor having a N-well supplied with said well potential Vw and having a gate controlled by said switch control circuit.

10. An output driver circuit according to claim 9, wherein said switch control circuit comprises:

a third switching element, connected between said output and said gate of said third pMOS transistor, having a control input supplied with said first power-supply potential VDD at said output, being turned on when Vo>VDD, being turned off when Vo<VDD; and a fourth switching element, connected between said second wiring and said gate of said third pMOS transistor, being turned on when a control signal to its control input is active, being turned off when said control signal is inactive.

11. An output driver circuit according to claim 10, wherein said third switching element includes:

a fourth pMOS transistor, said fourth MOS transistor having an N-well supplied with said N-well potential Vw.

12. An output driver circuit according to claim 11, wherein said fourth switching element includes:
a first nMOS transistor receiving said control signal at its gate.

13. An output driver circuit according to claim 12, wherein said fourth switching element further includes:
a second nMOS transistor, connected between said gate of said third pMOS transistor and said first nMOS transistor, said second nMOS transistor having a gate supplied with such a third power-supply potential that said second nMOS transistor is on when said first nMOS transistor is on.

14. An output driver circuit according to claims 3, further comprising:
a third nMOS transistor connected between said nMOS pull-down transistor and said pMOS pull-up transistor, said third nMOS transistor having a gate supplied with such a fourth power-supply potential that said third nMOS transistor is on when said pull-down nMOS transistor is on.

15. An output driver circuit according to claims 9, further comprising:
a third nMOS transistor connected between said nMOS pull-down transistor and said pMOS pull-up transistor, said third nMOS transistor having a gate supplied with such a fourth power-supply potential that said third nMOS transistor is on when said pull-down nMOS transistor is on.

16. An output driver circuit according to claim 10, wherein said fourth switching element includes:
a first nMOS transistor receiving said control signal at its gate.

17. An output driver circuit according to claims 10, further comprising:
a third nMOS transistor connected between said nMOS pull-down transistor and said pMOS pull-up transistor, said third nMOS transistor having a gate supplied with such a fourth power-supply potential that said third nMOS transistor is on when said pull-down nMOS transistor is on.

18. An output driver circuit according to claims 11, further comprising:
a third nMOS transistor connected between said nMOS pull-down transistor and said pMOS pull-up transistor, said third nMOS transistor having a gate supplied with such a fourth power-supply potential that said third nMOS transistor is on when said pull-down nMOS transistor is on.

19. An output driver circuit according to claims 1, further comprising:
a third nMOS transistor connected between said nMOS pull-down transistor and said pMOS pull-up transistor, said third nMOS transistor having a gate supplied with such a fourth power-supply potential that said third nMOS transistor is on when said pull-down nMOS transistor is on.

20. A semiconductor device comprising an output driver circuit formed on a semiconductor chip, said output driver circuit including a pMOS pull-up transistor formed on a N-well and an nMOS pull-down transistor, said pMOS pull-up transistor and said nMOS pull-down transistor being connected in series between first and second wirings, said first wiring being supplied with a first power-supply potential VDD, said second wiring being supplied with a second power-supply potential VSS that is lower than said first power-supply potential VDD, drains of said pMOS pull-up transistor and said nMOS pull-down transistor being connected to an output of said output driver circuit, comprising:
a first power-supply circuit, supplied with said first power-supply potential VDD and a potential Vo at said output, for generating a potential approximately equal to the higher of said first power-supply potential VDD and said potential Vo at said output as an N-well potential Vw to supply to said N-well; and
a second power-supply circuit, supplied with said first power-supply potential VDD and the potential Vo, having a switching element for high voltage cutoff connected between said first wiring and a source of said pMOS pull-up transistor, and having a switch control circuit for turning off said switching element when Vo>VDD and for turning on said switching element when Vo<VDD.

* * * * *